US012691758B2

(12) United States Patent
Son et al.

(10) Patent No.: US 12,691,758 B2
(45) Date of Patent: Jul. 28, 2026

(54) DISPLAY DEVICE

(71) Applicant: LG Display Co., Ltd., Seoul (KR)

(72) Inventors: Sungsik Son, Paju-si (KR); Sangmoo Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/790,759

(22) Filed: Jul. 31, 2024

(65) Prior Publication Data

US 2025/0214433 A1 Jul. 3, 2025

(30) Foreign Application Priority Data

Dec. 28, 2023 (KR) ........................ 10-2023-0194377

(51) Int. Cl.
| | |
|---|---|
| *G06F 3/041* | (2006.01) |
| *B60K 35/22* | (2024.01) |
| *B60K 35/25* | (2024.01) |
| *B60K 35/26* | (2024.01) |
| *H10K 59/131* | (2023.01) |
| *H10K 59/40* | (2023.01) |
| *H10K 59/80* | (2023.01) |

(Continued)

(52) U.S. Cl.
CPC ............ *B60K 35/25* (2024.01); *B60K 35/223* (2024.01); *B60K 35/26* (2024.01); *H10K 59/131* (2023.02); *H10K 59/40* (2023.02); *H10K 59/873* (2023.02); *H10K 77/111* (2023.02); *B60K 2360/1438* (2024.01); *H10K 2102/311* (2023.02)

(58) Field of Classification Search
CPC .......... B60K 2360/1438; B60K 35/223; B60K 35/25; B60K 35/26; H10K 2102/311; H10K 59/131; H10K 59/40; H10K 59/873; H10K 77/111
See application file for complete search history.

(56) References Cited

U.S. PATENT DOCUMENTS 10,345,910 B1 7/2019 Khoshkava et al.
11,498,422 B2 11/2022 Jeon
(Continued)

FOREIGN PATENT DOCUMENTS

JP 2022-105326 A 7/2022
JP 2022-173152 A 11/2022
(Continued)

OTHER PUBLICATIONS

Japan Patent Office, Office Action, Japanese Patent Application No. 2024-135255, Jul. 29, 2025, eight pages.

*Primary Examiner* — Insa Sadio
(74) *Attorney, Agent, or Firm* — Fenwick & West LLP

(57) ABSTRACT

The present disclosure relates to a display device which includes a cover window; a display panel disposed under the cover window; at least one plate disposed under the display panel; a vibration bracket attached to a lower portion of the at least one plate; and a vibration film attached to a lower portion of the vibration bracket, wherein the vibration bracket includes a leg protruding upward. A leg structure of the vibration bracket can reinforce vibrations in a depth direction, and a bridge structure can reinforce vibrations in a planar direction. A user may experience an in-depth haptic response and sound. The display device according to the present disclosure may be applied to a display for a vehicle.

18 Claims, 14 Drawing Sheets

(51) Int. Cl.
  *H10K 77/10*        (2023.01)
  *H10K 102/00*        (2023.01)

(56)                 References Cited

U.S. PATENT DOCUMENTS

| | | | | |
|---|---|---|---|---|
| 2008/0111651 A1* | 5/2008 | Isobe | .................... | H03H 9/172 |
| | | | | 310/322 |
| 2019/0384403 A1 | 12/2019 | Khoshkava et al. | | |
| 2021/0086617 A1 | 3/2021 | Jeon | | |
| 2021/0200265 A1* | 7/2021 | Ko | ........................ | G06F 1/1626 |
| 2022/0208133 A1 | 6/2022 | Nam et al. | | |
| 2022/0371052 A1 | 11/2022 | Kim et al. | | |
| 2023/0217184 A1 | 7/2023 | Nam et al. | | |

FOREIGN PATENT DOCUMENTS

| | | |
|---|---|---|
| JP | 2023-099448 A | 7/2023 |
| KR | 10-2013-0123275 A | 11/2013 |
| KR | 10-2038020 B1 | 10/2019 |
| KR | 10-2019-0142262 A | 12/2019 |

* cited by examiner

DISPLAY DEVICE

CROSS-REFERENCE TO RELATED APPLICATION

The present application claims the priority from Republic of Korea Patent Application No. 10-2023-0194377, filed on Dec. 28, 2023, which is hereby incorporated by reference in its entirety.

BACKGROUND

Field

The present disclosure relates to a display device, and more specifically, to a display device, which includes a bracket capable of reinforcing vibrations activated upon touch in a depth direction and may be mounted in a vehicle.

Description of Related Art

Display devices may be mounted on electronic products or home appliances, such as televisions, monitors, laptop computers, smart phones, tablet computers, electronic pads, wearable devices, watches, navigation systems, or vehicle control display devices, and used as screens to display images.

A display device may include a sound device. The sound device is a device for generating sounds by vibrating a plate. The sound device may be a vibration device. The vibration device is generally disposed on a back surface of a display panel. Since sounds output from the sound device travels backward or downward from the display device, there is a problem in that the sound quality deteriorates and the user's sense of immersion decreases due to interference with nearby structures.

In addition, the display device may adopt haptic characteristics that indicate whether a user manipulates the display device by vibrating the display device in response to the user's manipulation such as a touch input. To provide the haptic characteristics of the display device, vibration energy should be generated in response to electrical signals. To generate the vibration energy, a vibration device, such as a piezoelectric actuator using piezoelectric materials, may be used. The piezoelectric actuator may be configured in a form of a film. There is a need to efficiently transmit the vibration generated by such a vibration device to the user.

SUMMARY

The present disclosure is directed to providing a display device for effectively transmitting vibrations of a vibration film included in the display device to a user. Specifically, the present disclosure is directed to providing the display device for effectively transmitting vibrations generated by the vibration film in a depth direction.

According to the present disclosure, disclosed is a display device including a cover window, a display panel disposed under the cover window, at least one plate disposed under the display panel, a vibration bracket attached to a lower portion of the at least one plate, and a vibration film attached to a lower portion of the vibration bracket, wherein the vibration bracket includes a leg protruding upward.

According to the present invention, a leg structure of the vibration bracket can reinforce vibrations in a depth direction, and a bridge structure can reinforce vibrations in a planar direction. A user may experience an in-depth haptic response and sound.

DETAILED DESCRIPTION

Figure 1:
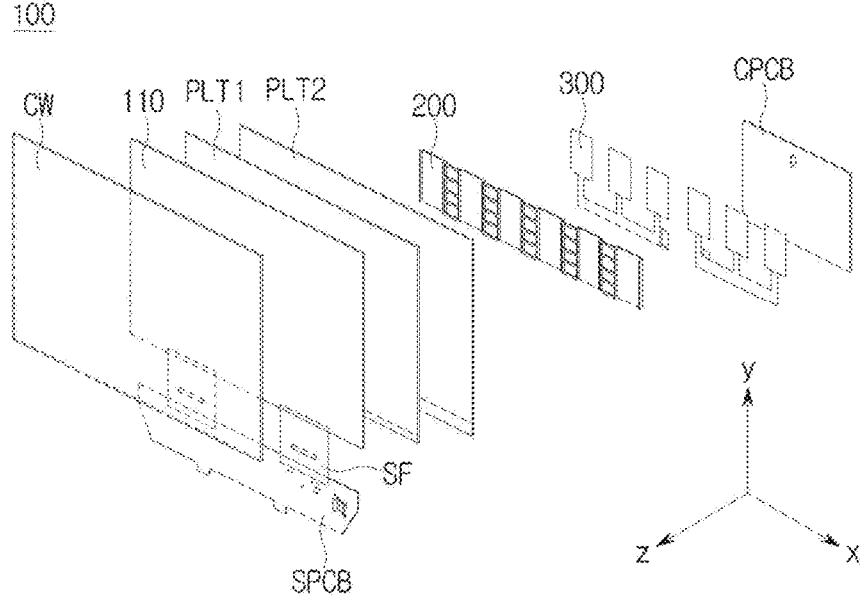
FIG. 1 is a view showing a display device according to the present disclosure.

Advantages and features of the present disclosure and methods for achieving them will become clear with reference to embodiments described below in detail in conjunction with the accompanying drawings. However, the present disclosure is not limited to the embodiments disclosed below but can be implemented in various different forms, the embodiments are merely provided to make the disclosure of the present disclosure complete and fully inform those skilled in the art to which the present disclosure pertains of the scope of the present disclosure, and the present disclosure is only defined by the scope of the appended claims.

Since shapes, sizes, ratios, angles, numbers, and the like disclosed in the drawings for describing the embodiments of the present disclosure are illustrative, the present disclosure is not limited to the illustrated items. The same reference number indicates the same components throughout the specification. In addition, in describing the present disclosure, when it is determined that the detailed description of a related known technology may unnecessarily obscure the gist of the present disclosure, detailed description thereof will be omitted. When terms "comprises," "has," "include" and the like described in the present specification are used, other parts may be added unless "only" is used. When a component is expressed in the singular, it includes a case in which the component is provided as a plurality of components unless specifically stated otherwise.

In construing a component, the component is construed as including the margin of error even when there is no separate explicit description.

When the positional relationship is described, for example, when the positional relationship between two parts is described using the term "on," "above," "under," "next to," or the like, one or more other parts may be positioned between the two parts unless the term "immediately" or "directly" is used.

When an element or a layer is described as being disposed "on" another element or layer, it includes both a case in which the element or the layer is disposed directly on another element or layer and a case in which other layers or elements are interposed therebetween.

Although terms such as first and second are used to describe various components, the components are not limited by the terms. The terms are only used to distinguish one component from another. Therefore, a first component described below may be a second component within the technical spirit of the present disclosure.

The like reference number indicates the similar components throughout the specification.

The size and thickness of each component shown in the drawings are shown for convenience of description, and the present disclosure is not necessarily limited to the sizes and thicknesses of the components shown.

Features of various embodiments of the present disclosure can be partially or fully coupled or combined, and as can be fully understood by those skilled in the art, various technical interconnections and operations are possible, and the embodiments can be implemented independently of each other and implemented together in combination thereof.

Hereinafter, embodiments according to the present disclosure will be described in detail with reference to the accompanying drawings.

In the present disclosure, "display device" may include display devices, such as liquid crystal modules (LCMs), organic light emitting diode (OLED) modules, and quantum dot (QD) modules, which include a display panel and a driver for driving the display panel, in a narrow sense. In addition, the display device may also include equipment display devices including laptop computers, televisions, computer monitors, automotive displays, or other forms for a vehicle that are complete products or final products including the LCMs, the OLED modules, the QD modules, or the like, and set electronic devices or set devices, including mobile electronic devices such as smartphones or electronic pads.

Therefore, the display device in the present disclosure may include the display devices themself in the narrow sense, such as the LCMs, the OLED modules, or the QD modules, and set devices that are application products or end-consumer devices including the LCMs, the OLED modules, or the QD modules.

In addition, in some cases, the LCMs, the OLED modules, and the QD modules composed of the display panel, the driver, and the like are represented by "display device" in the narrow sense, and the electronic devices as final products including the LCMs, the OLED modules, and the QD modules may be separately represented by "set devices." For example, the display device in the narrow sense may be a concept including a display panel of the LCD, the OLED, or the QD and a source printed circuit board (PCB) that is a controller for driving the display panel and further includes a set PCB that is a set controller electrically connected to the source PCB to control the entire set device.

The display panel used in the present embodiment may use any type of display panels, such as LCD panels, OLED display panels, QD display panels, and electroluminescent display panels and is not limited to a specific display panel capable of bezel bending with a flexible substrate for an OLED display panel of the present embodiment and a back plate support structure thereunder. In addition, the display panel used in the display device according to the embodiment of the present disclosure is not limited to the shape or size of the display panel.

For example, when the display panel is the OLED display panel, the display panel may include a plurality of gate lines and data lines, and pixels formed in intersection areas of the gate lines and the data lines. In addition, the display panel may include an array including a thin film transistor that is an element for selectively applying a voltage to each pixel, an OLED layer disposed on the array, an encapsulation substrate or an encapsulation layer disposed on the array to cover the OLED layer, and the like. The encapsulation layer can protect the thin film transistor, the OLED layer, and the like from an external impact and prevent moisture or oxygen from permeating the OLED layer. In addition, the layer formed on the array may include an inorganic light emitting layer, such as a nano-sized material layer or quantum dots.

The display panel in the present disclosure is, for example, an exemplary OLED display panel that may be integrated into display devices.

FIG. 1 is a view showing a display device according to the present disclosure.

Referring to FIG. 1, a display device 100 includes a cover window CW, a display panel 110, a first plate PLT1, a second plate PLT2, a vibration bracket 200, a vibration film 300, and the like. The display device 100 includes a source film SF electrically connected to the display panel 110 and a source board SPCB electrically connected to the source film SF. The display device 100 includes a control board CPCB electrically connected to the vibration film 300 and the source board SPCB.

In describing the present embodiment, a downward direction indicates a −z-axis direction from the cover window CW to the control board CPCB. In addition, an upward direction is a direction opposite to the downward direction and indicates a z-axis direction from the control board CPCB to the cover window CW.

A user's touch operation is performed on the cover window CW. Vibration corresponding to the touch occurs from the vibration film 300. The generated vibrations travel from the vibration film 300 toward the cover window CW. Therefore, from the viewpoint of traveling vibrations, the z-axis direction or the upward direction may be referred to as a depth direction.

The cover window CW is disposed above the display panel 110. The cover window CW may be made of a glass or plastic material. When there is the user's touch input, the cover window CW may be in contact with the user's finger or may be in contact with an electronic device such as a pencil.

The display panel 110 is disposed under the cover window CW. The display panel 110 and the cover window CW may be bonded using a bonding material such as OCA, OCR, or PSA. The display panel 110 may include elements such as a polarizer, a panel layer, and a touch electrode. In particular, when the display panel 110 is applied to a vehicle, the display panel 110 may include an element such as a viewing angle control film. The viewing angle control film is a film for controlling an angle of light emitted from the display device 100. For example, recently, the display device 100 formed by integrating a driver cluster, a central center fascia monitor, and a passenger multimedia monitor has been used. The viewing angle control film can prevent the images displayed on the passenger multimedia monitor from being displayed in the driver's field of view.

The first plate PLT1 is disposed under the display panel 110. The first plate PLT1 may be referred to as a back plate. The first plate PLT1 is a rigid structure and may serve to reinforce the rigidity of the display panel 110. The first plate PLT1 may be formed of plastic thin film.

The second plate PLT2 is disposed under the first plate PLT1. The second plate PLT2 may be made of a metal material. The second plate PLT2 may serve to reinforce the rigidity of the display panel 110. The second plate PLT2 may serve to dissipate heat generated from the display panel 110, the control board CPCB, and the source board SPCB. The second plate PLT2 may be made of a metal material such as aluminum or magnesium or a plastic material with excellent thermal conductivity.

The vibration bracket 200 is disposed under the second plate PLT2 or attached to a lower portion of the second plate PLT2. The vibration bracket 200 may be attached to the second plate PLT2 using a predetermined bonding material. The bonding material (not shown) may include materials such as a bonding tape, OCA, PSA, and OCR. The vibration bracket 200 and the second plate PLT2 may be directly attached through the bonding material. The vibration bracket 200 may be made of a plastic or metal material. The vibration bracket 200 serves to transmit vibrations generated from the vibration film 300 to the second plate PLT2. Referring to the coordinate system of the display device 100 shown in FIG. 1, the x-axis direction can be defined as a width direction, the y-axis direction can be defined as a height direction, and the z-axis direction can be defined as a depth direction. The user sees the display device 100 in the z-axis direction, and the user inputs a touch from the z-axis direction to the −z-axis direction with respect to the cover window CW. The vibration bracket 200 includes bridges that transmit vibrations in the x-axis and y-axis directions and legs that transmit the vibrations in the z-axis direction, and the bridge and legs of the vibration bracket 200 will be described later.

According to the present disclosure, when the vibrations generated from the vibration film 300 are transmitted to the second plate PLT2, strengths of the vibrations may be reinforced by the vibration bracket 200. The reinforced vibrations may be in the z-axis direction that is the depth direction. The reinforced vibrations may be the x-axis and y-axis directions that are planar directions. When the vibrations are applied to the haptic characteristics, the user may experience the touch response reinforced in the depth direction. When the vibrations are applied to sounds, the user may experience the reinforced sounds.

The vibration film 300 is disposed under the vibration bracket 200. The vibration film 300 may be configured in a form of a thin film. The vibration film 300 may be, for example, a form including an anode and a cathode that apply electrical signals and a piezoelectric ceramic that is disposed between the anode and the cathode and generates vibration energy. The vibration film 300 may be, for example, represented by term such as a sound generating module, a sound generating device, a film actuator, a film-type composite actuator, or a film speaker. The vibrations generated by the vibration film 300 may use the second plate PLT2 as a vibration plate. The vibration film 300 may be attached to the vibration bracket 200 through a bonding material. To this end, the vibration bracket 200 may include a horizontal portion, which will be described below. To apply electrical signals to the electrodes of the vibration film 300, the vibration film 300 may be connected to the control board CPCB using a predetermined connector, which will be described below.

The source board SPCB may be electrically connected to the display panel 110 through the source film SF. The source film SF is configured in a form of a chip-on-film and may be configured in the form of a flexible PCB in which an integrated circuit (IC) referred to as a source driver or a data driver is embedded.

The control board CPCB may be disposed under the vibration film 300. The control board CPCB has several ICs, such as a timing controller, a power management circuit, and a touch driving circuit, mounted thereon and may be a rigid PCB. The control board CPCB may supply a signal for driving the vibration film 300 to the vibration film 300, and to this end, connectors may electrically connect the control board CPCB with the vibration film 300. Detailed description of the connectors will be made below. The control board CPCB may be electrically connected to the source board SPCB through connection members. The connecting members may include, for example, a flexible printed circuit, a flexible flat cable, and the like. In some cases, the source board SPCB and the control board CPCB can be implemented by being integrated into one circuit board.

The display device 100 according to FIG. 1 may be applied to TVs, monitors, PCs, or tablets. In addition, the display device 100 may be applied to vehicles. For example, the display device 100 may be applied to a cluster display, a center fascia display, a passenger's seat display, a rear seat display, and the like of the vehicle.

Figure 2:
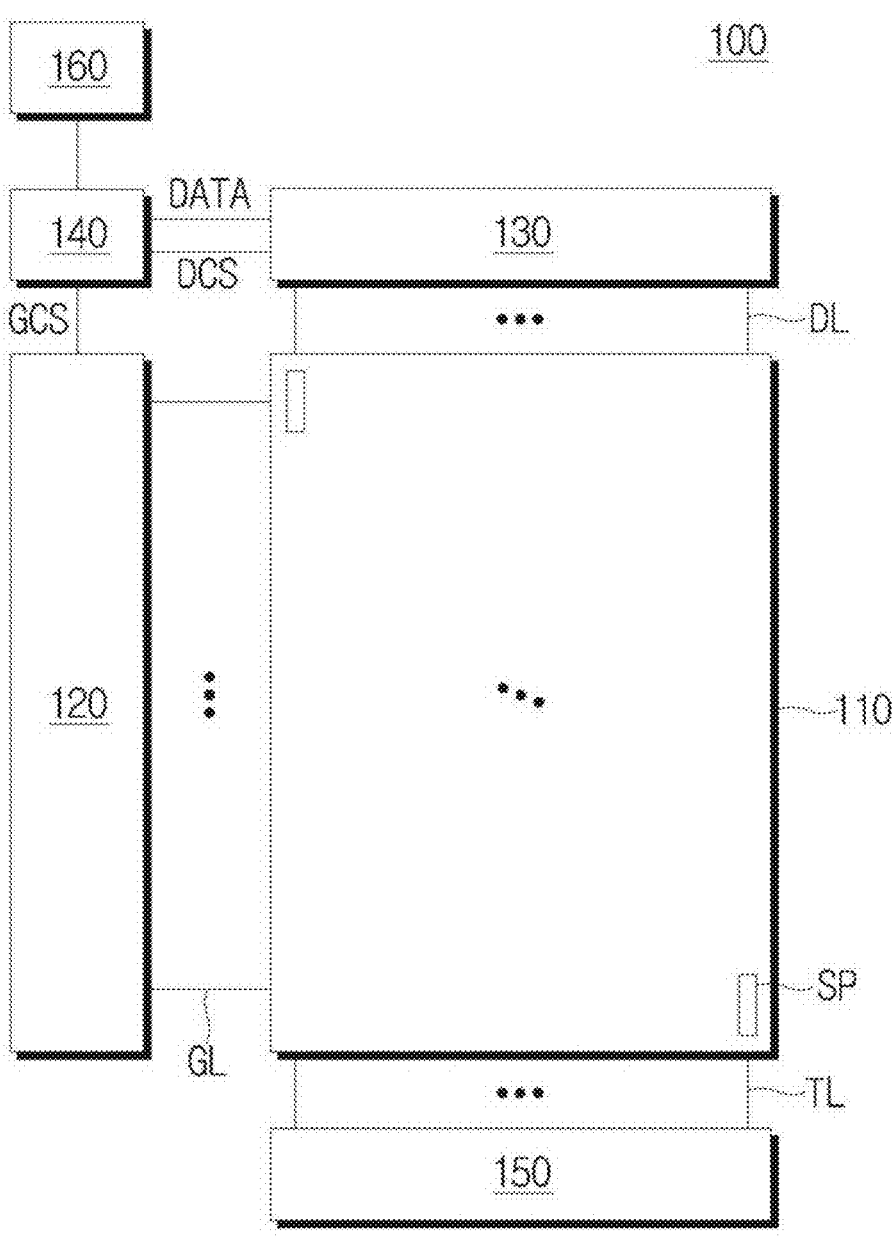
FIG. 2 is a conceptual diagram for describing a display device 100 according to the present disclosure.

FIG. 2 is a conceptual diagram for describing a display device 100 according to the present disclosure.

Referring to FIG. 2, the display device 100 according to the present disclosure includes a display panel 110, a gate driver 120, a data driver 130, a timing controller 140, a touch driver 150, and a power driver 160.

The display panel 110 includes a plurality of gate lines GL and a plurality of data lines DL. A plurality of sub-pixels SP are disposed at positions at which the gate lines GL and the data lines DL intersect. In addition, a plurality of touch electrodes may be disposed or embedded in the display panel 110. In addition, a plurality of touch lines TL electrically connecting the touch electrode with the touch driver 150 are disposed on the display panel 110.

The gate driver 120 outputs a signal for controlling the transistors of the sub-pixel SP. The gate driver 120 receives a gate control signal GCS from the timing controller 140. When data voltages corresponding to image data are supplied from the data driver 130 to the sub-pixel SP, images corresponding to gray levels of the image data are output on a screen under the control of the gate driver 120. The gate driver 120 may be positioned at only one side or both sides of the display panel 110 in a form of one or more ICs. The gate driver 120 can be implemented in a form of a gate in panel (GIP) directly embedded in the non-display area of the display panel 110.

The data driver 130 receives a data control signal DCS and digital image data DATA from the timing controller 140. The data driver 130 converts the image data DATA into an analog data voltage and outputs the analog data voltage to the data line DL. The data driver 130 may be configured in a form of an IC.

The timing controller 140 supplies the control signals to the gate driver 120 and the data driver 130 to control the operations of the gate driver 120 and the data driver 130. The timing controller 140 receives various timing signals including a vertical synchronization signal, a horizontal synchronization signal, a data enable signal, a clock signal, and the like in addition to the image data DATA from an external system (e.g., a host system). The timing controller 140 generates the data control signal DCS and the gate control signal GCS using various timing signals received from the external system and outputs the data control signal DCS and the gate control signal GCS to the data driver 130 and the gate driver 120, respectively. For example, signals output by the timing controller 140 to control the gate driver 120 include a gate start pulse, a gate shift clock, a gate output enable signal, and the like. For example, signals output by the timing controller 140 to control the data driver 130 include a source start pulse, a source sampling clock, a source output enable signal, and the like.

The touch driver 150 senses the user's touch input to the display device 100. The touch driver 150 may sense the presence or absence and location of the touch based on a difference in capacitance between electrodes formed on the display panel 110. The touch driver 150 may generate a touch sensing output signal about the presence or absence and location of the touch.

The power driver 160 adjusts a DC input voltage supplied from the external system to generate power required for the display device 100. The power driver 160 may generate a converter voltage required for driving various ICs, a high potential voltage and a low potential voltage that are supplied to the sub-pixels, a gate high voltage and a gate low voltage that are supplied to the gate driver 120, gamma voltages supplied to the data driver 130, and the like.

Figure 3:
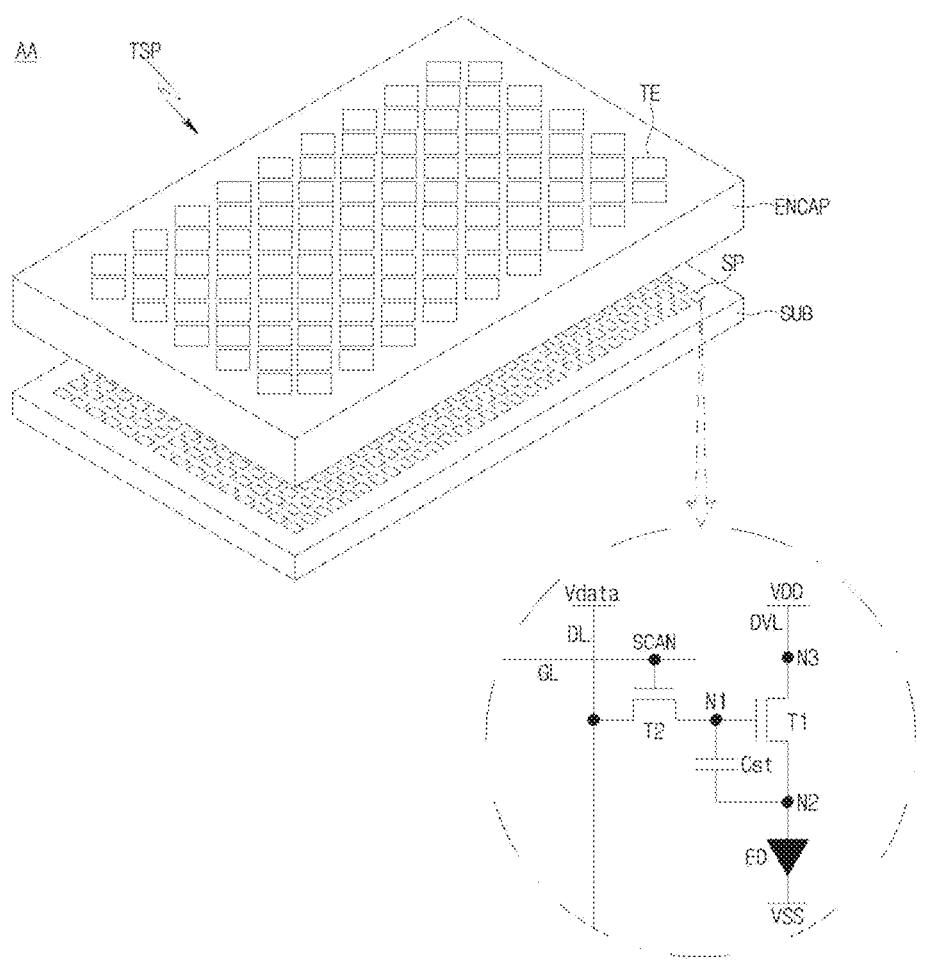
FIG. 3 is a view for exemplarily describing a structure in which a touch panel is embedded in the display device according to the present disclosure and a structure of a sub-pixel.

FIG. 3 is a view for exemplarily describing a structure in which a touch panel is embedded in the display device according to the present disclosure and a structure of a sub-pixel.

Referring to FIG. 3, a display area AA of the display panel 110 in the display device 100 according to the present disclosure is shown. The plurality of sub-pixels SP are arranged on the substrate SUB in the display area AA. Each sub-pixel SP may include a light emitting element ED, a first transistor T1 for driving the light emitting element ED, a second transistor T2 for transmitting a data voltage Vdata to a first node N1 of the first transistor T1, a storage capacitor Cst for maintaining a predetermined voltage for 1 frame, and the like.

The first transistor T1 may include the first node N1 to which the data voltage Vdata may be applied through the second transistor T2, a second node N2 electrically connected to the light emitting element ED, and a third node N3 to which a driving voltage VDD is applied from a driving voltage line DVL. The first node N1 may be a gate node, the second node N2 may be a source node or a drain node, and the third node N3 may be a drain node or a source node. The first transistor T1 is referred to as a driving transistor that drives the light emitting element ED.

The light emitting element ED may include a first electrode (e.g., an anode), a light emitting layer, and a second electrode (e.g., a cathode). The first electrode may be electrically connected to the second node N2 of the first transistor T1, and a base voltage VSS may be applied to the second electrode. In the light emitting element ED, the light emitting layer may be an organic light emitting layer containing an organic material. In this case, the light emitting element ED may be an OLED.

The second transistor T2 may be controlled to be turned on or off by the scan signal SCAN applied through the gate line GL and may be electrically connected between the first node N1 of the first transistor T1 and the data line DL. The second transistor T2 may be referred to as a switching transistor.

When the second transistor T2 is turned on by the scan signal SCAN, the data voltage Vdata supplied through the data line DL is transmitted to the first node N1 of the first transistor T1. The storage capacitor Cst may be electrically connected between the first node N1 and the second node N2 of the first transistor T1.

Each sub-pixel SP may have a 2T1C structure including two transistors T1 and T2 and one capacitor Cst and in some cases, may further include one or more transistors or one or more capacitors.

The storage capacitor Cst is not a parasitic capacitor that may be present between the first node N1 and the second node N2 of the first transistor T1, but may be an external capacitor intentionally designed outside the first transistor T1. The first transistor T1 and the second transistor T2 may each be an n-type transistor or a p-type transistor.

Meanwhile, circuit elements, such as the light emitting element ED, two or more transistors T1 and T2, and one or more capacitors Cst, are disposed on the display panel 110. Since the circuit elements are vulnerable to external moisture or oxygen, an encapsulation layer ENCAP for preventing external moisture or oxygen from permeating the circuit elements may be disposed on the display panel 110. In the display device 100 according to the present disclosure, a touch screen panel TSP may be formed on the encapsulation layer ENCAP and embedded in the display panel 110. In other words, in the display device 100, a plurality of touch electrodes TE forming the touch screen panel TSP may be disposed on the encapsulation layer ENCAP to form the display panel 110.

The display device 100 may be operated in a capacitance-based touch sensing method and may sense the touch in a mutual capacitance method and the touch in a self-capacitance method.

In the mutual capacitance-based touch sensing method, the plurality of touch electrodes TE may be classified into a touch driving electrode to which a touch driving signal is applied through a touch driving line, and a touch sensing electrode that senses a touch sensing signal through a touch sensing line and generates a capacitance with the touch driving electrode. In this case, the touch driving line and the touch sensing line may be collectively referred to as "touch line," and the touch driving signal and the touch sensing signal may be collectively referred to as "touch signal." In the mutual capacitance-based touch sensing method, the presence or absence of the touch, touch coordinates, and the like are detected based on a change in mutual capacitance generated between the touch driving electrode and the touch sensing electrode depending on the presence or absence of a pointer such as a finger or a pen.

In the self-capacitance-based touch sensing method, each touch electrode TE serves as both the touch driving electrode and the touch sensing electrode. In other words, the touch driving signal is applied to the touch electrode TE through one touch line, and the touch sensing signal transmitted from the touch electrode TE to which the touch driving signal is applied is received through the same touch line. Therefore, in the self-capacitance-based touch sensing method, there is no distinction between the touch driving electrode and the touch sensing electrode and the touch driving line and the touch sensing line. In the self-capacitance-based touch sensing method, the presence or absence of the touch, touch coordinates, and the like are detected based on a change in capacitance generated between the pointer, such as a finger or a pen, and the touch electrode TE.

As described above, the touch display device 100 may sense the touch using the mutual capacitance-based touch sensing method or the self-capacitance-based touch sensing method.

Figure 4:
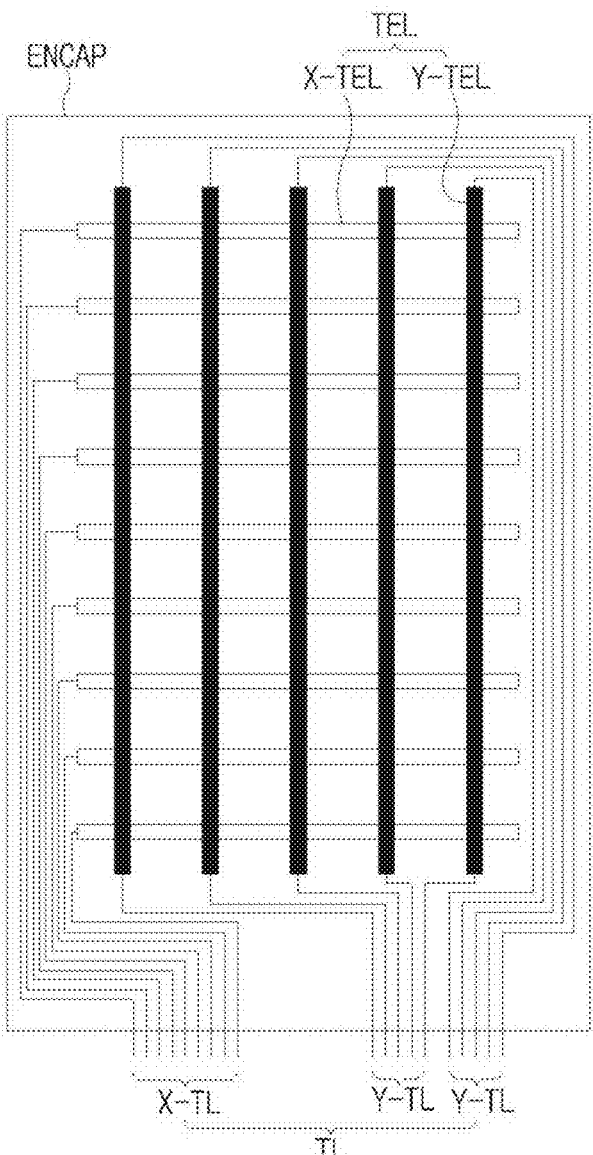
FIG. 4 is a view schematically showing a touch electrode structure for sensing a mutual capacitance-based touch in the display device according to the present disclosure.

FIG. 4 is a view schematically showing a touch electrode structure for sensing a mutual capacitance-based touch in the display device according to the present disclosure.

Referring to FIG. 4, a touch electrode structure of the display device according to the present disclosure may include a plurality of X-touch electrode lines X-TEL and a plurality of Y-touch electrode lines Y-TEL. Here, the plurality of X-touch electrode lines X-TEL and the plurality of Y-touch electrode lines Y-TEL are located above the encapsulation layer ENCAP. The plurality of X-touch electrode lines X-TEL may each be disposed in a first direction, and the plurality of Y-touch electrode lines Y-TEL may each be disposed in a second direction that differs from the first direction.

The plurality of X-touch electrode lines X-TEL may each be formed of a plurality of X-touch electrodes electrically connected to each other. The plurality of Y-touch electrode lines Y-TEL may each be formed of a plurality of Y-touch electrodes electrically connected to each other. Here, the plurality of X-touch electrodes and the plurality of Y-touch electrodes are electrodes that are included in the plurality of touch electrodes TE and have different roles (functions). For example, the plurality of X-touch electrodes forming each of the plurality of X-touch electrode lines X-TEL may be the touch driving electrodes, and the plurality of Y-touch electrodes forming each of the plurality of Y-touch electrode lines Y-TEL may be the touch sensing electrodes. In this case, the plurality of X-touch electrode lines X-TEL each corresponds to the touch driving electrode line, and the plurality of Y-touch electrode lines Y-TEL each corresponds to the touch sensing electrode line.

The plurality of touch lines TL may include one or more X-touch lines X-TL connected to each of the plurality of X-touch electrode lines X-TEL, and one or more Y-touch lines Y-TL connected to each of the plurality of Y-touch electrode lines Y-TEL.

Figure 5:
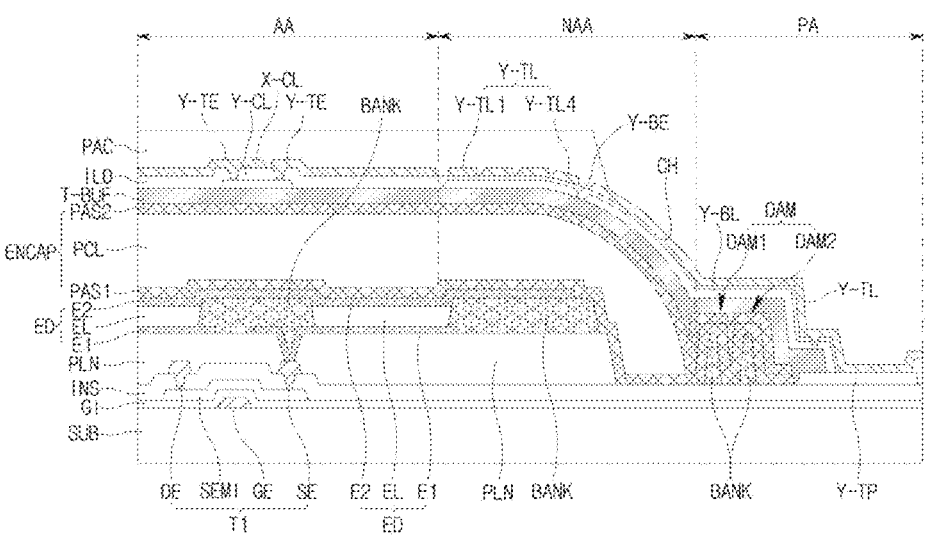
FIG. 5 is a view exemplarily showing a cross section of a portion of the display device according to the present disclosure.

FIG. 5 is a view exemplarily showing a cross section of a portion of the display device according to the present disclosure.

Referring to FIG. 5, the first transistor T1, which is a driving transistor, is disposed on the substrate SUB in the sub-pixel SP located in the display area AA. The first transistor T1 includes a gate electrode GE, a source electrode SE, a drain electrode DE, a semiconductor layer SEMI, and the like.

The gate electrode GE and the semiconductor layer SEMI overlap each other with a gate insulating film GI interposed therebetween. The source electrode SE is formed on an insulating layer INS and is in contact with one side of the semiconductor layer SEMI, and the drain electrode DE is formed on the insulating layer INS and is in contact with the other side of the semiconductor layer SEMI.

The light emitting element ED includes a first electrode E1 corresponding to an anode, a second electrode E2 corresponding to a cathode, and a light emitting layer EL disposed therebetween. The first electrode E1 is electrically connected to the source electrode SE of the first transistor T1 exposed through a contact hole passing through a planarization film PLN. The light emitting layer EL is formed on the first electrode E1 in an emission area partitioned by a bank BANK. The second electrode E2 is formed opposite to the first electrode E1 with the light emitting layer EL interposed therebetween.

The encapsulation layer ENCAP is a layer that protects the light emitting element ED vulnerable to external moisture or oxygen. The encapsulation layer ENCAP may be formed in a single layer structure or a plurality of stacked structures PAS1, PCL, and PAS2. The encapsulation layer ENCAP may include one or more inorganic encapsulation layers PAS1 and PAS2 and one or more organic encapsulation layers PCL. The inorganic encapsulation layers PSA1 and PAS2 may be made of, for example, an inorganic insulating material capable of low-temperature deposition, such as silicon nitride ($SiN_x$), silicon oxide ($SiO_x$), silicon oxynitride (SiON), or aluminum oxide ($Al_2O_3$). The organic encapsulation layer PCL may be formed to expose an end of the first inorganic encapsulation layer PAS1. The organic encapsulation layer PCL may serve as a buffer for reducing stress between the layers due to bending of a touch display device that is an OLED display device and serve to reinforce planarization performance. For example, the organic encapsulation layer PCL may be made of an organic insulating material such as an acrylic resin, an epoxy resin, polyimide, polyethylene, or silicon oxycarbon (SiOC).

One or more dams DAM may be formed in a non-display area NAA. The dam DAM can prevent the organic encapsulation layer PCL from collapsing in the non-display area NAA and entering a pad area PA. The dam DAM may have a dual structure of a first dam DAM1 and a second dam DAM2. The dams DAM1 and DAM2 may each be formed in a single-layer structure or a multi-layer structure. For example, the dam DAM may have a stacked structure of the bank BANK, the first inorganic encapsulation layer PAS1, and the second inorganic encapsulation layer PAS2.

A touch buffer layer T-BUF may be disposed on the encapsulation layer ENCAP. The touch buffer layer T-BUF may be located between a touch sensor metal including the touch electrodes (X-TE and) Y-TE and touch electrode connection lines X-CL and Y-CL and the second electrode E2 of the light emitting element ED. The touch buffer layer T-BUF may be designed so that a separation distance between the touch sensor metal and the second electrode E2 of the light emitting element ED maintains a predetermined minimum separation distance (e.g., 1 μm). Therefore, it is possible to reduce or prevent the parasitic capacitance generated between the touch sensor metal and the second electrode E2 of the light emitting element ED, thereby preventing a reduction in touch sensitivity due to the parasitic capacitance.

On the touch buffer layer T-BUF, the X-touch electrode lines X-TEL and the Y-touch electrode lines Y-TEL may be disposed, and the X-touch electrode lines X-TEL and the Y-touch electrode lines Y-TEL may be disposed to intersect each other. The Y-touch electrode lines Y-TEL may include a plurality of Y-touch electrode connection lines Y-CL that electrically connect the plurality of Y-touch electrodes Y-TE. In this case, the plurality of Y-touch electrodes Y-TE and the plurality of Y-touch electrode connection lines Y-CL may be located on different layers with an interlayer dielectric ILD interposed therebetween.

The Y-touch electrode lines Y-TEL may be electrically connected to the touch driver 150 through the Y-touch lines Y-TL and Y-touch pads Y-TP. Likewise, the X-touch electrode lines X-TEL may be electrically connected to the touch driver 150 through the X-touch lines X-TL and X-touch pads (not shown).

The Y-touch line Y-TL may be electrically connected to the Y-touch electrode Y-TE through a touch line contact hole or integrated with the Y-touch electrode Y-TE. The Y-touch line Y-TL may extend to the non-display area NAA and may be electrically connected to the Y-touch pad Y-TP after passing through upper surface and side surfaces of the encapsulation layer ENCAP and upper surface and side surfaces of the dam DAM. Therefore, the Y-touch line Y-TL may be electrically connected to the touch driver 150 through the Y-touch pad Y-TP. A Y-touch bridge line Y-BL connected through a contact hole CH may be disposed under the Y-touch line Y-TL in the non-display area NAA. Since the Y-touch line Y-TL and the Y-touch bridge line Y-BL are electrically connected through at least one contact hole CH formed at regular intervals, the same touch driving signal or touch sensing signal may be transmitted.

Meanwhile, a touch protective film PAC may be disposed above the X-touch electrode (X-TE) and the Y-touch electrode Y-TE. The touch protection film PAC may extend to a front or rear portion of the dam DAM and may be disposed on the X-touch line X-TL and the Y-touch line Y-TL.

Figure 6:
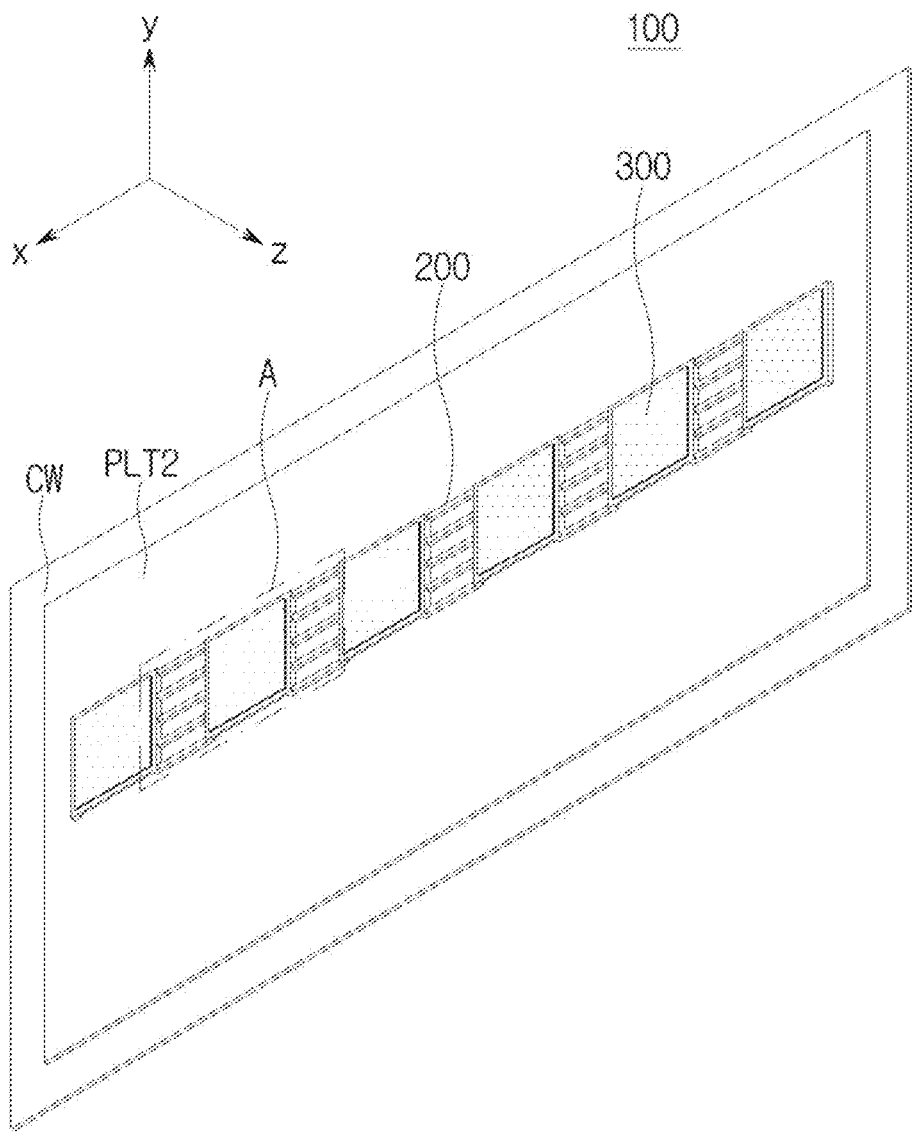
FIG. 6 is a perspective view showing the display device according to the present disclosure.

FIG. 6 is a perspective view showing the display device according to the present disclosure.

Figure 7:
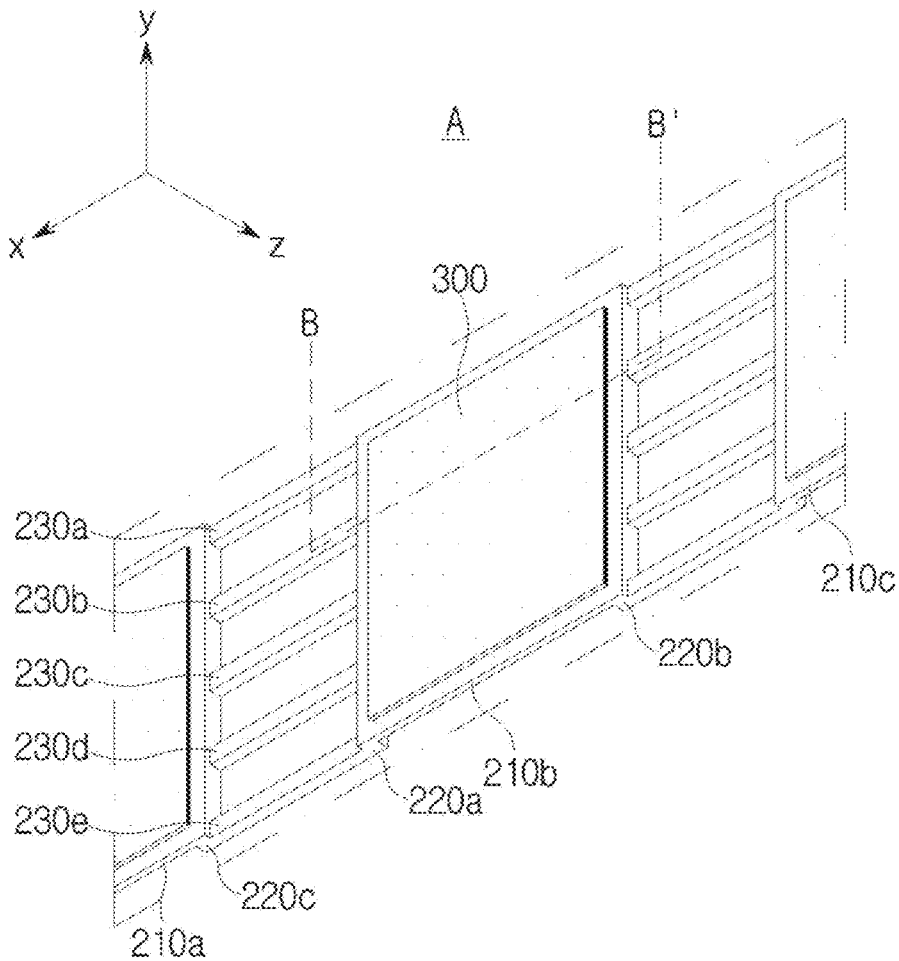
FIG. 7 is an enlarged view of portion A in the display device shown in FIG. 6.

FIG. 7 is an enlarged view of portion A in the display device shown in FIG. 6.

Figure 8:
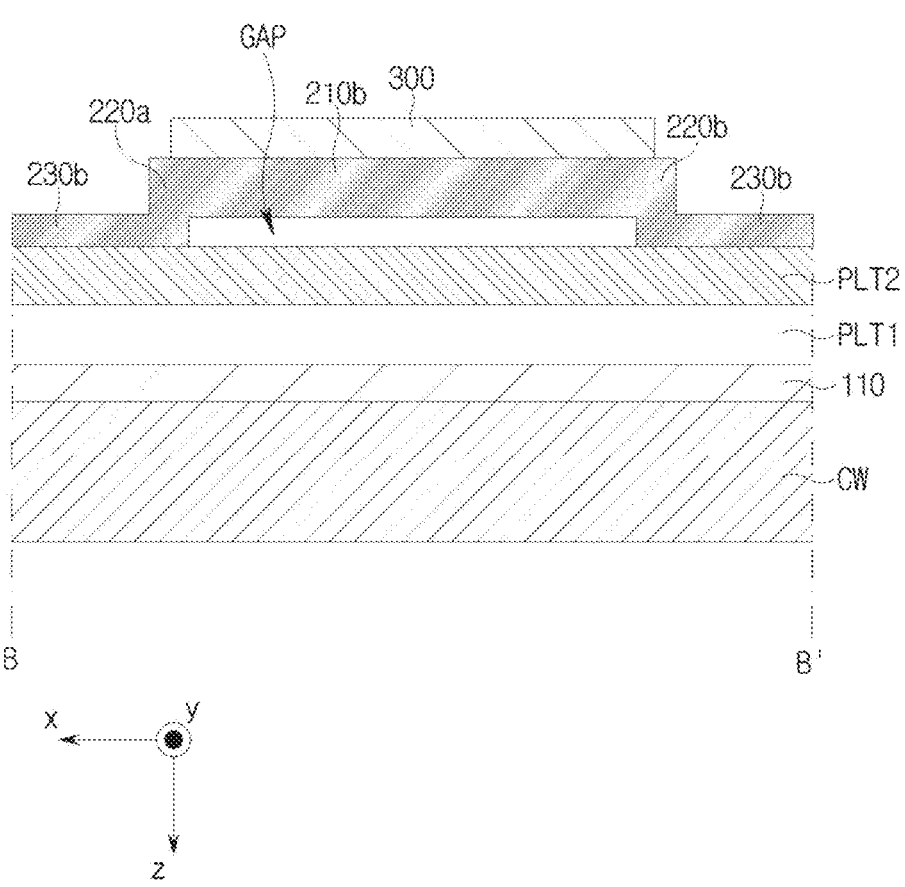
FIG. 8 is a cross-sectional view along line B-B' in the display device shown in FIG. 7.

FIG. 8 is a cross-sectional view along line B-B' in the display device shown in FIG. 7.

Referring to FIG. 6, as elements constituting the display device 100, the cover window CW, the second plate PLT2, the vibration bracket 200, and the vibration film 300 are shown.

The cover window CW is disposed on an outermost portion on which the user's touch is input. A direction from the cover window CW to the vibration film 300 is defined as the −z-axis direction and is defined as the downward direction. Conversely, a direction from the vibration film 300 to the cover window CW is defined as the z-axis direction and is defined as the upward direction.

As described with reference to FIG. 1, the display panel 110 and the first plate PLT1 may be disposed between the cover window CW and the second plate PLT2, and detailed descriptions thereof are replaced with the contents described with reference to FIG. 1 and the like.

The second plate PLT2 is disposed under the cover window CW. The second plate PLT2 may be made of a metal material, such as aluminum or magnesium, or a plastic material. The second plate PLT2 may serve as a vibration plate, and the vibrations generated from the vibration film 300 is transmitted to the second plate PLT2 through the vibration bracket 200. When the present disclosure is applied to the haptic, the second plate PLT2 can reinforce haptic vibrations. When the present disclosure is applied to sounds, the second plate PLT2 can reinforce sounds.

The vibration bracket 200 is disposed under the second plate PLT2. The vibration bracket 200 may be attached to the second plate PLT2 using a predetermined bonding material. As shown in FIGS. 7 and 8, the vibration bracket 200 includes a horizontal part 210, a leg 220, and a bridge 230.

The horizontal part 210 indicates a part parallel to a plane defined by the x-axis and the y-axis of the vibration bracket 200. The horizontal part 210 may have a square plate shape of which horizontal and vertical sizes are the same and have a rectangular plate shape of which horizontal and vertical sizes differ from each other. The vibration film 300 may be attached to a lower portion of the horizontal part 210. A predetermined bonding material may be used to attach the horizontal part 210 and the vibration film 300. As shown in FIG. 6, one vibration bracket 200 may include six horizontal parts 210, six is an exemplary number, and the technical spirit of the present disclosure is not limited to the number. As shown in the enlarged view of FIG. 7, each horizontal part 210 may be referred to as a first horizontal part 210a, a second horizontal part 210b, and a third horizontal part 210c. The vibration film 300 may be attached to each of the plurality of horizontal parts.

The leg 220 indicates a part that protrudes in the z-axis direction, which is an upward direction, from one side and the other side of the horizontal part 210. The first leg 220a is a part that protrudes upward from the one side of the horizontal part, and the second leg 220b is a part that protrudes upward from the other side of the horizontal part. The leg 220 may have a shape extending along the y-axis direction of the horizontal part 210. Therefore, one horizontal part 210 includes two legs 220.

Vibrations are generated by the vibration film 300. The leg 220 can derive the effect of reinforcing the vibrations in the z-axis direction, which is the upward direction and the depth direction. Specifically, the second plate PLT2 is located upward, which is a protruding direction of the leg 220. Therefore, the vibrations of the second plate PLT2 are reinforced upward. The display panel 110 and the cover window CW are located upward from the second plate PLT2. The user inputs a touch on the cover window CW. In a case in which the display device 100 according to the present disclosure is applied to the haptic, when the user makes the touch input, the user may experience the haptic response with a reinforced sense of depth through his/her finger in contact with the cover window CW. In a case in which the display device 100 according to the present disclosure is applied to the sound, when the user makes the touch input, the user may experience the reinforced sounds in the depth direction.

Meanwhile, a separation distance GAP is formed between the vibration bracket 200 and the second plate PLT2 by the leg 220. Any material is not filled inside the separation distance GAP, and atmospheric air may be present therein. In some cases, the inside of the separation distance GAP may be filled with a material that reinforces vibrations. For example, vibration reinforcing materials may be referred to as "piezoelectric materials." The piezoelectric materials may include one or more among a polyvinylidene fluoride (PVDF) polymer doped with PVDF, polyvinylidene fluoride-co-trifluoroethylene (P(VDF-TrFE)), a moderated ferroelectric polymer, P(VDF-TrFe-CFE), P(VDF-TrFE-CTFE), carbon nanotube (CNT), or the like and poly[bis (trifluoroethoxy)phosphazene], but is not limited thereto. For example, the piezoelectric material may include a polymer material with a light transmittance at a predetermined level or higher and piezoelectricity.

The separation distance GAP may be 1 mm or more. Specifically, a distance between a lower surface of the second plate PLT2 and an upper surface of the horizontal part 210b may be 1 mm or more as the separation distance GAP. When the separation distance GAP is 2 mm, vibrations may have optimal performance.

The bridge 230 has a shape that extends between adjacent legs 220. As shown in FIG. 7, the third leg 220c is located at the other side of the first horizontal part 210a. The first leg 220a is located at one side of the second horizontal part 210b. The bridge 230 extends between the third leg 220c and the first leg 220a. In FIG. 7, a first bridge 230a to a fifth bridge 230e are shown. The number of bridges 230 is illustrative and does not limit the technical spirit of the present disclosure.

Vibrations are generated by the vibration film 300. The bridge 230 can derive the effect of reinforcing vibrations in a planar direction defined by the x-axis and y-axis directions. Specifically, the bridge 230 has a shape that extends in the planar direction. Therefore, the vibrations are reinforced in the planar direction. The vibrations generated when the user makes the touch input on the cover window CW may be reinforced in the planar direction.

Figure 9:
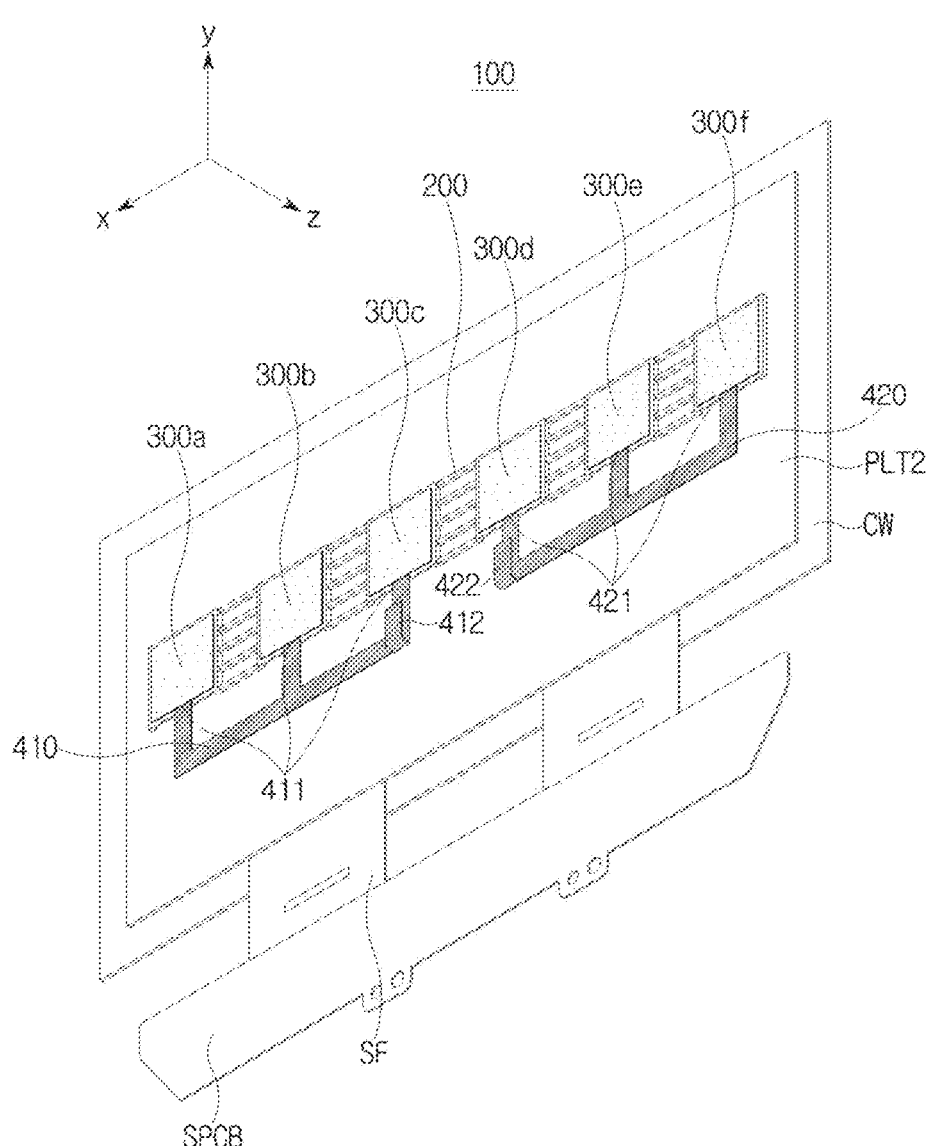
FIG. 9 is a perspective view showing the display device according to the present disclosure.

FIG. 9 is a perspective view showing the display device according to the present disclosure.

Figure 10:
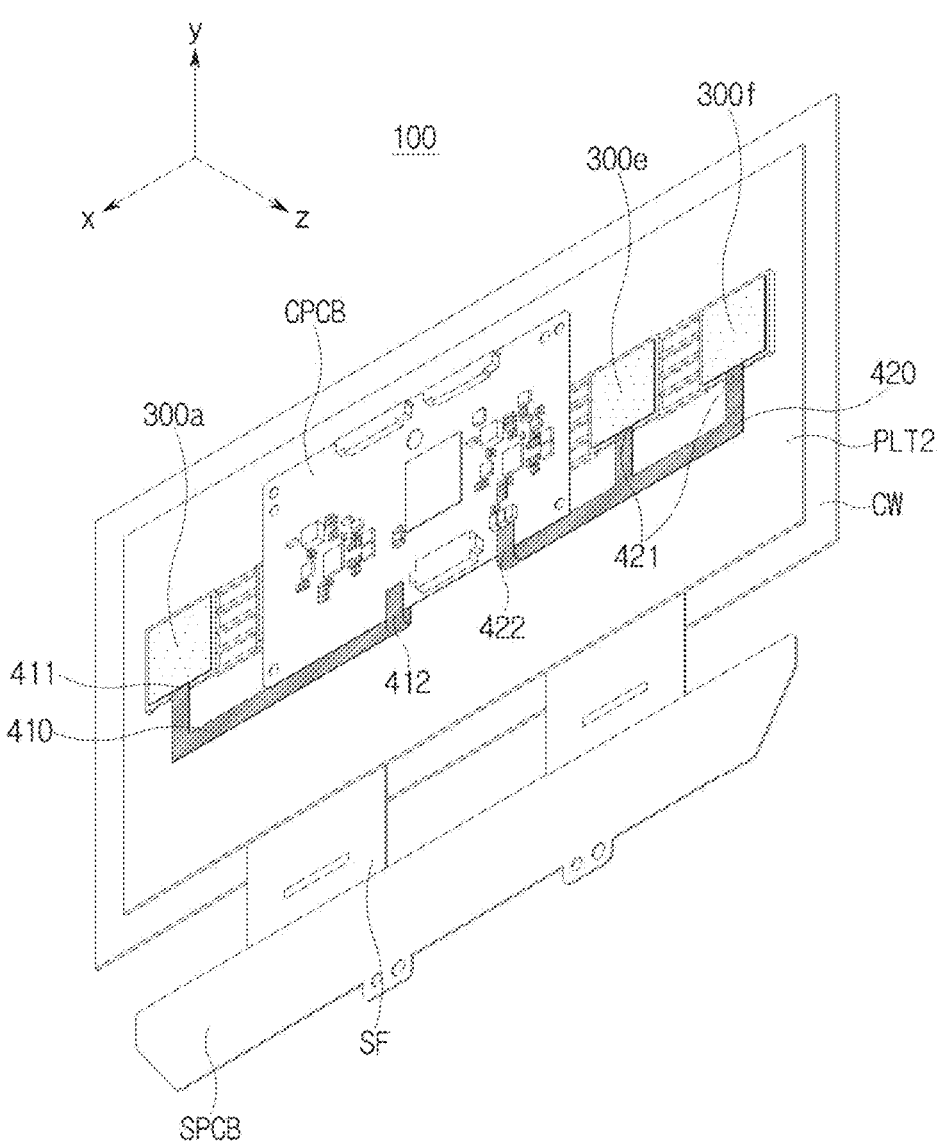
FIG. 10 is a perspective view showing the display device according to the present disclosure.

FIG. 10 is a perspective view showing the display device according to the present disclosure.

The connection of the vibration film 300 and the control board CPCB according to the present disclosure will be described with reference to FIGS. 9 and 10.

Referring to FIG. 9, as elements constituting the display device 100, the cover window CW, the second plate PLT2, the vibration bracket 200, the vibration film 300, the connector 400, the source board SPCB, and the source film SF are shown.

Referring to FIGS. 9 and 10, six vibration films 300 are shown. Each vibration film 300 is referred to as a first vibration film 300a, a second vibration film 300b, a third vibration film 300c, a fourth vibration film 300d, a fifth vibration film 300e, and a sixth vibration film 300f. The number of vibration films 300 is illustrative, and the technical spirit of the present disclosure is not limited thereto.

Referring to FIGS. 9 and 10, two connectors 400 are shown. Each connector 400 is referred to as a first connector 410 and a second connector 420.

The cover window CW is disposed on the outermost portion on which the user's touch is input. The direction from the cover window CW to the vibration film 300 is defined as the −z-axis direction and is defined as the downward direction. Conversely, the direction from the vibration film 300 to the cover window CW is defined as the z-axis direction and is defined as the upward direction.

As described with reference to in FIG. 1, the display panel 110 and the first plate PLT1 may be disposed between the cover window CW and the second plate PLT2. Detailed descriptions of the display panel 110 and the first plate PLT1 are replaced with the contents described with reference to FIG. 1 and the like. The display panel 110 and the source board SPCB are electrically connected through the source film SF. Detailed descriptions of the source board SPCB and the source film SF are replaced with the contents described with reference to FIG. 1 and the like.

The second plate PLT2 is disposed under the cover window CW. The vibration bracket 200 is disposed under the second plate PLT2. The vibration film 300 is disposed under the vibration bracket 200. Detailed descriptions of the vibration bracket 200 and the vibration film 300 are replaced with the contents described with reference to FIGS. 6 to 8.

The vibration film 300 is connected to the connector 400. The first connector 410 includes a first terminal 411 and a second terminal 412. The second connector 420 includes a first terminal 421 and a second terminal 422. The first to third vibration films 300a, 300b, and 300c are connected to the first connector 410, and the fourth to sixth vibration films 300d, 300e, and 300f are connected to the second connector 420.

Each of the connectors 410 and 420 may have lines for controlling the vibrations of the vibration film 300 embedded therein. The vibration film 300 may include an anode, a cathode, and piezoelectric ceramic therebetween. The vibration film 300 may vibrate at an intensity corresponding to a difference between voltages applied to the anode and the cathode. Each of the connectors 410 and 420 may include lines for applying the voltages to the anode and the cathode. The voltages may be applied from the control board CPCB. The first terminals 411 and 421 are terminals for applying the voltages to the vibration film 300. The second terminals 412 and 422 are terminals for receiving the voltages from the control board CPCB.

Each of the connectors 410 and 420 may have a different number of first terminals 411 and 421 and second terminals 412 and 422. In the example shown in FIG. 9, the number of first terminals 411 and 421 is three, and the number of second terminals 412 and 422 is one. Therefore, the number of first terminals 411 and 421 may be larger than the number of second terminals 412 and 422. The first terminal 411 is connected to each of the vibration films 300a, 300b, and 300c. The second terminal 412 is connected to the control board CPCB as shown in FIG. 10. The second connector 420 includes three first terminals 421 and one second terminal 422. The first terminal 421 is connected to each of the vibration films 300d, 300e, and 300f. The second terminal 422 is connected to the control board CPCB as shown in FIG. 10.

According to the present disclosure, six vibration films 300 (300a to 300f) may be attached to one vibration bracket 200. The three vibration films 300a to 300c at one side of the display device 100 may be commonly connected to one first connector 410. The three vibration films 300d to 300f at the other side of the display device 100 may be commonly connected to one second connector 420. The first connector 410 and the second connector 420 may be connected to one control board CPCB through the second terminals 412 and 422.

Figure 11:
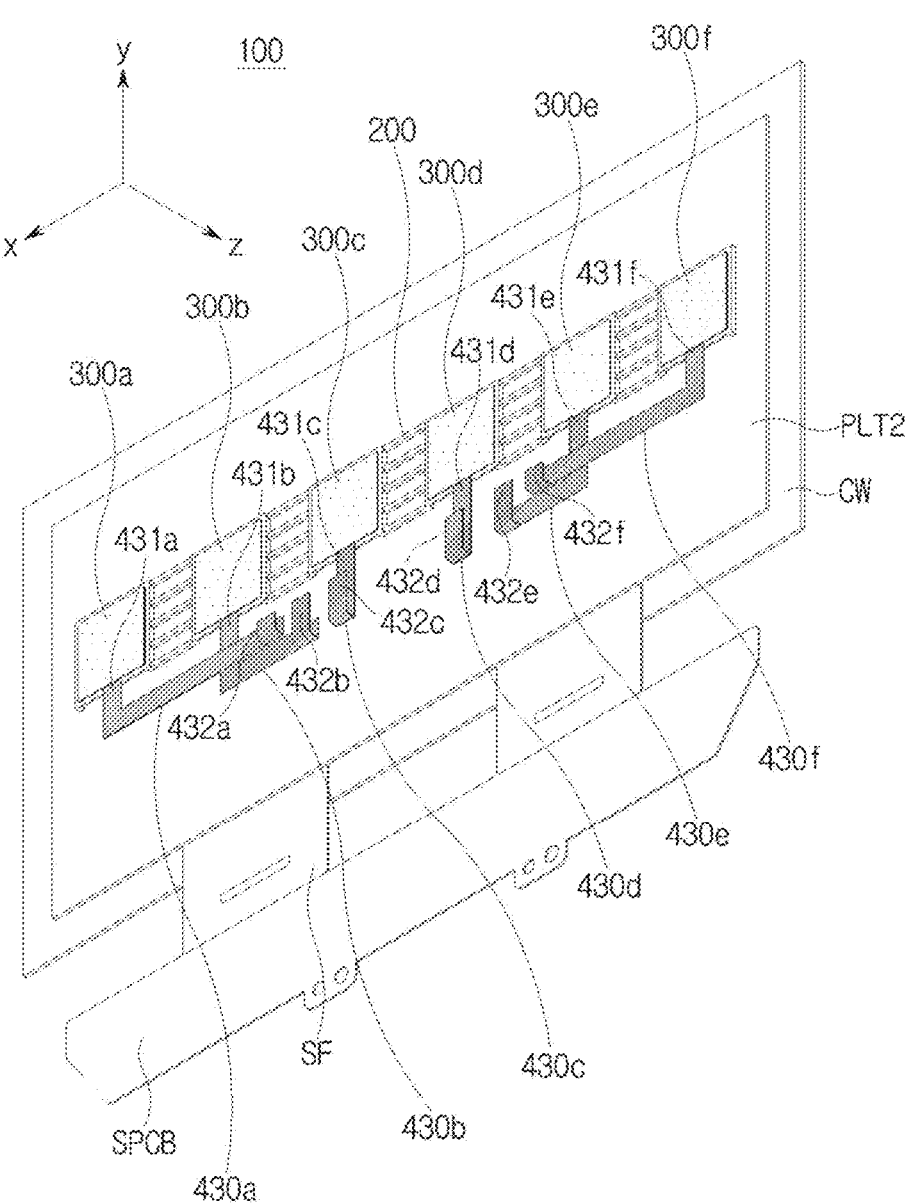
FIG. 11 is a perspective view showing the display device according to the present disclosure.

FIG. 11 is a perspective view showing the display device according to the present disclosure.

Figure 12:
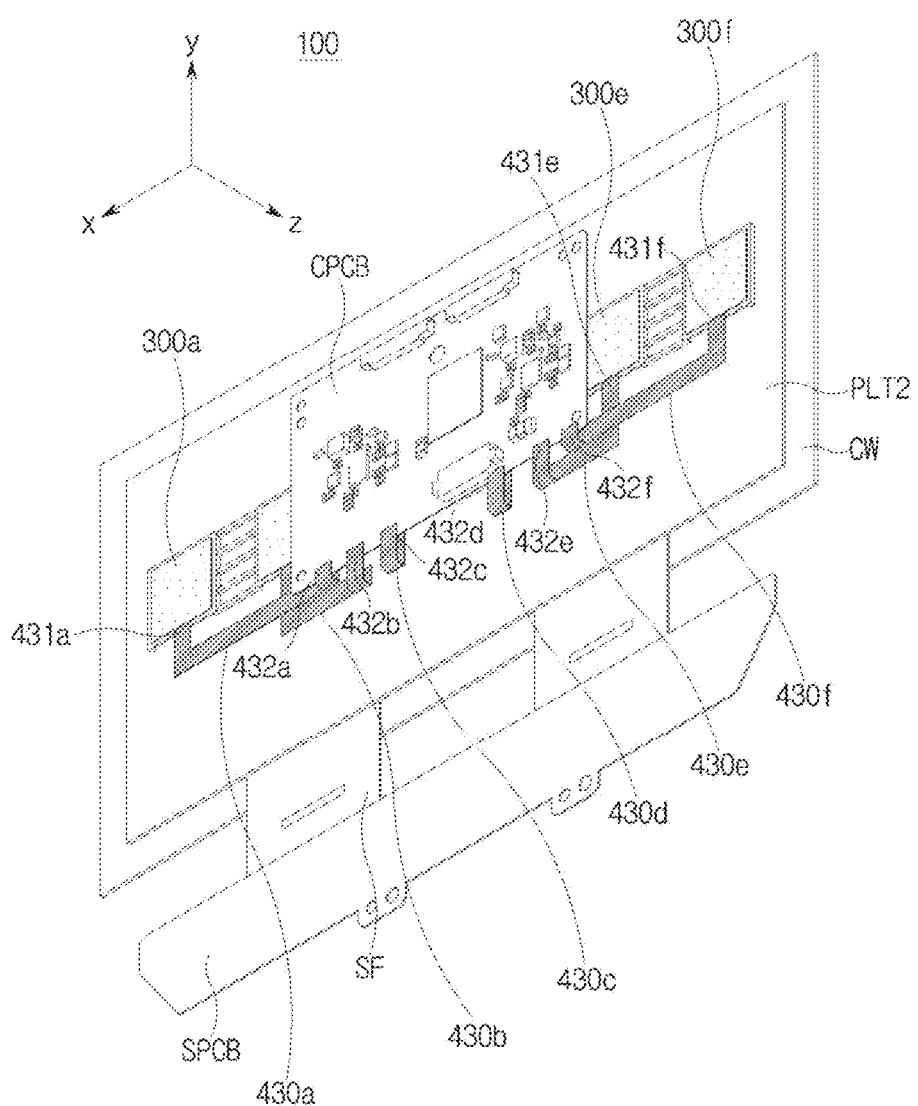
FIG. 12 is a perspective view showing the display device according to the present disclosure.

FIG. 12 is a perspective view showing the display device according to the present disclosure.

Another method of the connection of the vibration film 300 and the control board CPCB according to the present disclosure will be described with reference to FIGS. 11 and 12.

Referring to FIG. 11, as elements constituting the display device 100, the cover window CW, the second plate PLT2, the vibration bracket 200, the vibration film 300, the connector 430, the source board SPCB, and the source film SF are shown.

Referring to FIGS. 11 and 12, six vibration films 300 are shown. Each vibration film 300 is referred to as the first vibration film 300a, the second vibration film 300b, the third vibration film 300c, the fourth vibration film 300d, the fifth vibration film 300e, and the sixth vibration film 300f. The number of vibration films 300 is illustrative, and the technical spirit of the present disclosure is not limited thereto.

Referring to FIGS. 11 and 12, six connectors 430a to 430f are shown. Each connector 430 is referred to as a first connector 430a, a second connector 430b, a third connector 430c, a fourth connector 430d, a fifth connector 430e, and a sixth connector 430f.

The cover window CW is disposed on the outermost portion on which the user's touch is input. The direction from the cover window CW to the vibration film 300 is defined as the −z-axis direction and is defined as the downward direction. Conversely, the direction from the vibration film 300 to the cover window CW is defined as the z-axis direction and is defined as the upward direction.

As described with reference to in FIG. 1, the display panel 110 and the first plate PLT1 may be disposed between the cover window CW and the second plate PLT2. Detailed descriptions of the display panel 110 and the first plate PLT1 are replaced with the contents described with reference to FIG. 1 and the like. The display panel 110 and the source board SPCB are electrically connected through the source film SF. Detailed descriptions of the source board SPCB and the source film SF are replaced with the contents described with reference to FIG. 1 and the like.

The second plate PLT2 is disposed under the cover window CW. The vibration bracket 200 is disposed under the second plate PLT2. The vibration film 300 is disposed under the vibration bracket 200. Detailed descriptions of the vibration bracket 200 and the vibration film 300 are replaced with the contents described with reference to FIGS. 6 to 8.

The vibration film 300 is connected to the connector 430. Each of the connectors 430a to 430f includes one of first terminals 431a to 431f and one of second terminals 432a to 432f. Specifically, each of the first to sixth vibration films 300a to 300f is connected to one of the connectors 430a to 430f through one of the first terminals 431a to 431f. Each of the connectors 430a to 430f is connected to the control board CPCB through one of the second terminals 432a to 432f.

Therefore, the number of connectors 430a to 430f may be the same as the number of first terminals 431a to 431f and the number of second terminals 432a to 432f. The number of first terminals 431a to 431f of each connector 430a to 430f is one, and the number of second terminals 432a to 432f thereof is also one, that is, the number of first terminals are the same as the number of second terminals.

The connector 430 may have the lines for controlling the vibrations of the vibration film 300 embedded therein. The vibration film 300 may include an anode, a cathode, and piezoelectric ceramic therebetween. The vibration film 300 may vibrate at an intensity corresponding to a difference between voltages applied to the anode and the cathode. The connector 430 may include lines for applying the voltages to the anode and the cathode. The voltages may be applied from the control board CPCB. The first terminals 431a to 431f are terminals for applying the voltages to the vibration film 300. The second terminals 432a to 432f are terminals for receiving the voltages from the control board CPCB.

As shown in FIGS. 11 and 12, each of the connectors 430a to 430f is connected to one of the vibration films 300a to 300f. Each of the connectors 430a to 430f includes one of the first terminals 431a to 431f and one of the second terminals 432a to 432f. Therefore, the number of first terminals 431a to 431f may be the same as the number of second terminals 432a to 432f.

According to the present disclosure, six vibration films 300 (300a to 300f) may be attached to one vibration bracket 200. One of the vibration films 300a to 300f may be connected to one of the connectors 430a to 430f. Each of the connectors 430a to 430f may be connected to one control board CPCB.

Therefore, the plurality of connectors 430a to 430f may overlap each other. For example, as shown in FIGS. 11 and 12, the first connector 430a and the second connector 430b overlap each other with respect to x and y planes. In addition, the fifth connector 430e and the sixth connector 430f overlap each other with respect to the x and y planes. Since some of the plurality of connectors 430a to 430f overlap each other, the connection to the control board CPCB can be easy. If unlike FIGS. 11 and 12, to prevent the plurality of connectors 430a to 430f from overlapping each other, the first connector 430a and the sixth connector 430f should be attached to a side surface parallel to the y-axis direction of the control board CPCB. In this case, the arrangement of the connection terminals of the control board CPCB will be inevitably complicated.

Figure 13:
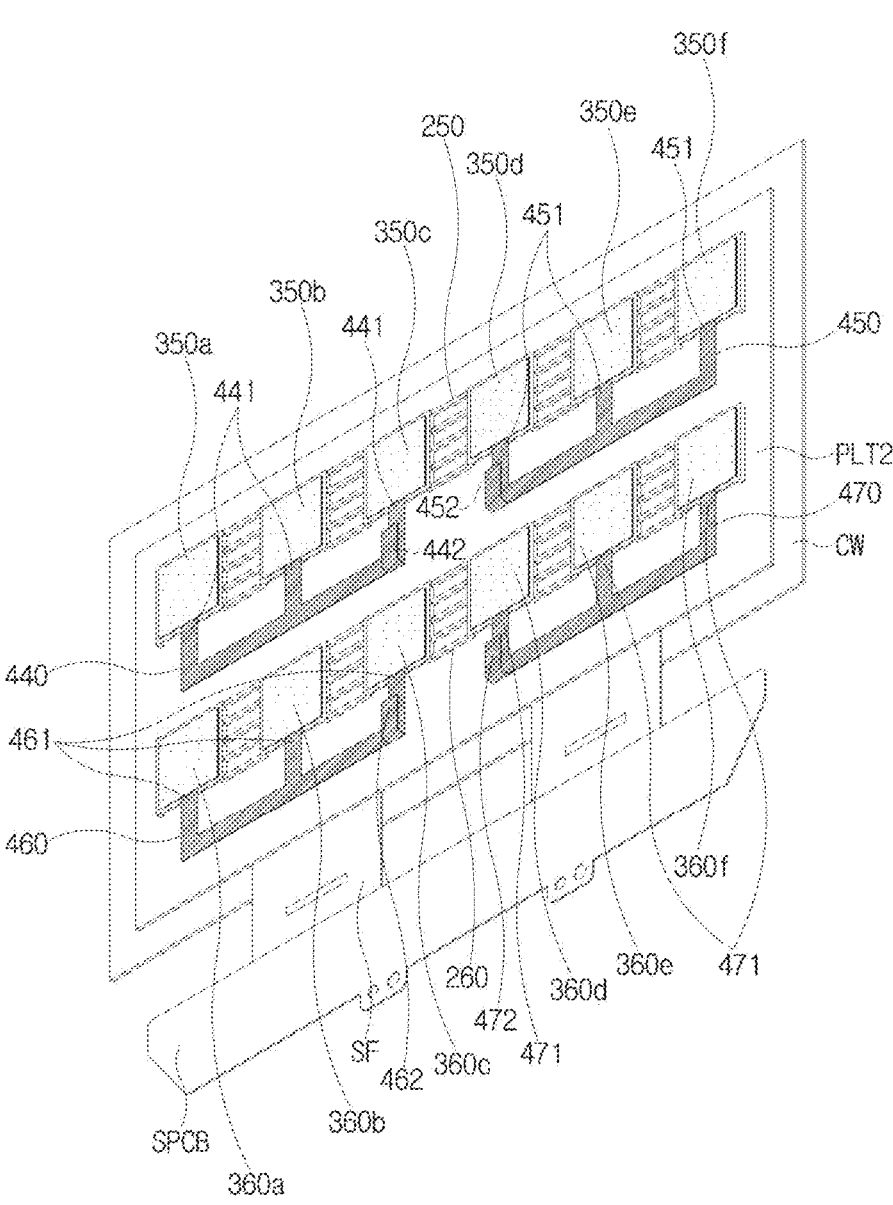
FIG. 13 is a perspective view showing the display device according to the present disclosure.

FIG. 13 is a perspective view showing the display device according to the present disclosure.

Another embodiment of the vibration bracket according to the present disclosure will be described with reference to FIG. 13.

Referring to FIG. 13, as elements constituting the display device, the cover window CW, the second plate PLT2, the vibration bracket 200, the vibration film 300, the connector 400, the source board SPCB, and the source film SF are shown.

Referring to FIG. 13, two vibration brackets 200 are shown. Each vibration bracket 200 is referred to as a first vibration bracket 250 and a second vibration bracket 260. The number of vibration brackets 200 is illustrative, and the technical spirit of the present disclosure is not limited thereto.

Referring to FIG. 13, six vibration films 300 are attached to the first vibration bracket 250. Each vibration film 300 is referred to as first to sixth vibration films 350a to 350f. The six vibration films 300 are attached to the second vibration bracket 260. Each vibration film 300 is referred to as seventh to twelfth vibration film 360a to 360f. The number of vibration films 300 is illustrative, and the technical spirit of the present disclosure is not limited thereto.

Referring to FIG. 13, four connectors 400 are shown. Each connector 400 is referred to as a first connector 440, a second connector 450, a third connector 460, and a fourth connector 470. The first connector 440 and the second connector 450 are connected to the first vibration bracket 250. The third connector 460 and the fourth connector 470 are connected to the second vibration bracket 260. Each connector 400 includes a first terminal and a second terminal. The first connector 440 includes three first terminals 441 and one second terminal 442. The second connector 450 includes three first terminals 451 and one second terminal 452. The third connector 460 includes three first terminals 461 and one second terminal 462. The fourth connector 470 includes three first terminals 471 and one second terminal 472.

The cover window CW is disposed on the outermost portion on which the user's touch is input. The direction from the cover window CW to the vibration film 300 is defined as the −z-axis direction and is defined as the downward direction. Conversely, the direction from the vibration film 300 to the cover window CW is defined as the z-axis direction and is defined as the upward direction.

As described with reference to in FIG. 1, the display panel 110 and the first plate PLT1 may be disposed between the cover window CW and the second plate PLT2. Detailed descriptions of the display panel 110 and the first plate PLT1 are replaced with the contents described with reference to FIG. 1 and the like. The display panel 110 and the source board SPCB are electrically connected through the source film SF. Detailed descriptions of the source board SPCB and the source film SF are replaced with the contents described with reference to FIG. 1 and the like.

The second plate PLT2 is disposed under the cover window CW. The vibration bracket 200 is disposed under the second plate PLT2. The vibration film 300 is disposed under the vibration bracket 200. Detailed descriptions of the vibration bracket 200 and the vibration film 300 are replaced with the contents described with reference to FIGS. 6 to 8.

The first vibration film 350a to the third vibration film 350c are connected to the first connector 440. The fourth vibration film 350d to the sixth vibration film 350f are connected to the second connector 450. The seventh vibration film 360*a* to the ninth vibration film 360*c* are connected to the third connector 460. The tenth vibration film 360*d* to the twelfth vibration film 360*f* are connected to the fourth connector 470.

The first connector 440 includes the first terminal 441 connected to the vibration film and the second terminal 442 connected to the control board CPCB. The second connector 450 includes the first terminal 451 connected to the vibration film and the second terminal 452 connected to the control board CPCB. The third connector 460 includes the first terminal 461 connected to the vibration film and the second terminal 462 connected to the control board CPCB. The fourth connector 470 includes the first terminal 471 connected to the vibration film and the second terminal 472 connected to the control board CPCB. The second terminals 442, 452, 462, and 472 may be connected to one control board CPCB.

According to the present disclosure, one display device 100 includes two vibration brackets 250 and 260. The six vibration films 350*a* to 350*f* or 360*a* to 360*f* may be attached to each of the vibration bracket 250 and 260. The three vibration films 350*a* to 350*c* at one side of the display device may be commonly connected to the first connector 440. The three vibration films 350*d* to 350*f* at the other side of the display device 100 may be commonly connected to the second connector 450. The three vibration films 360*a* to 360*c* at one side of the display device 100 may be commonly connected to the third connector 460. The three vibration films 360*d* to 360*f* at the other side of the display device may be commonly connected to the fourth connector 470. The four connectors 440 to 470 may be connected to one control board CPCB through the second terminals 442, 452, 462, and 472.

Figure 14:
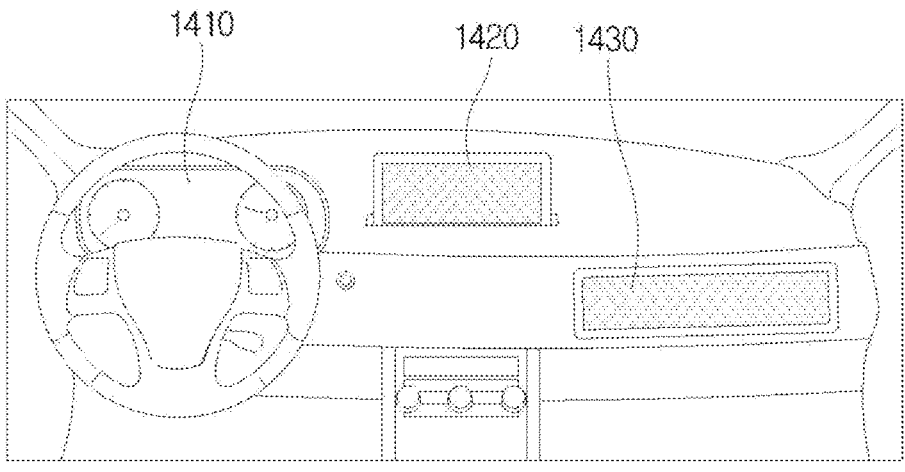
FIG. 14 is a view showing a vehicle in which the display device according to the present disclosure is mounted.

FIG. 14 is a view showing a vehicle in which the display device according to the present disclosure is mounted.

Referring to FIG. 14, the vehicle according to the present disclosure includes a cluster display 1410, a center fascia display 1420, and a passenger display 1430.

The cluster display 1410 may display various pieces of traveling-related information about a traveling time, speed, fuel amount, and engine RPM of the vehicle, and information about vehicle status information to the driver.

The center fascia display 1420 may display various pieces of information about an audio system, an air conditioning system, and a navigation system to the driver.

The passenger display 1430 may display information about multimedia images to the passenger.

The display device according to the present disclosure may be applied to the cluster display 1410, the center fascia display 1420, and the passenger display 1430. In a case in which the display device according to the present disclosure is applied to the haptic, when the user makes the touch input, the user may experience the haptic response with a reinforced sense of depth through his/her finger in contact with the cover window. In a case in which the display device according to the present disclosure is applied to the sound, when the user makes the touch input, the user may experience the reinforced sounds in the depth direction.

According to the present disclosure, disclosed is a display device including a cover window, a display panel disposed under the cover window, at least one plate disposed under the display panel, a vibration bracket attached to a lower portion of the at least one plate, and a vibration film attached to a lower portion of the vibration bracket, wherein the vibration bracket includes a leg protruding upward.

The leg may include a first leg disposed at one side of the display device and a second leg disposed at the other side thereof.

The vibration bracket may further include a plurality of bridges extending from the legs.

The vibration bracket may further include a horizontal part to which the vibration film is attached.

A separation space may be formed between the horizontal part and the at least one plate.

The display device may further include a piezoelectric material disposed in the separation space.

The horizontal part may include a plurality of horizontal parts including a first horizontal part and a second horizontal part, and the vibration film may be attached to each of the plurality of horizontal parts.

The at least one plate may include a first plate disposed under the display panel and a second plate disposed under the first plate, and the second plate may be made of a metal material.

The second plate and the vibration bracket may be directly attached through a bonding material.

The display device may further include a connector electrically connecting the vibration film with a control board.

The connector may include a first terminal connected to the vibration film and a second terminal connected to the control board.

The number of first terminals may be larger than the number of second terminals.

The number of first terminals may be the same as the number of second terminals.

The connector may include a plurality of connectors, and some of the plurality of connectors may overlap each other.

The vibration bracket may include a plurality of brackets including a first bracket and a second bracket.

According to the present disclosure, when vibrations generated from the vibration film are transmitted to a second plate, strengths of the vibrations can be reinforced by the vibration bracket. The reinforced vibrations may be in a z-axis direction that is a depth direction. The reinforced vibrations may be x-axis and y-axis directions that are planar directions. When the vibrations are applied to the haptic, the user may experience the touch response reinforced in the depth direction. When the vibrations are applied to sounds, the user may experience the reinforced sounds.

The embodiments of the present disclosure have been described above with reference to the accompanying drawings. The present disclosure is not necessarily limited to the embodiments. The present disclosure may be modified variously without departing from the technical spirit of the present disclosure. Therefore, it should be understood that the embodiments of the present disclosure are for illustrative purposes rather than limiting the technical contents. The scope of the present disclosure should be defined by the claims. In addition, all technical spirits within the equivalent scope of the claims should be construed as being included in the technical spirit of the present disclosure.

What is claimed is:

1. A display device comprising:
    a cover window;
    a display panel disposed under the cover window;
    at least one plate disposed under the display panel;
    a vibration bracket attached to a lower portion of the at least one plate;
    a plurality of vibration films attached to a lower portion of the vibration bracket; and a plurality of connectors electrically connecting the vibration film with a control board;

wherein the vibration bracket includes a leg protruding upward, wherein the vibration bracket further includes a plurality of bridges extending from the leg and disposed between the plurality of vibration films adjacent to each other, and wherein the vibration film includes a plurality of vibration films at one side of the display device which are commonly connected to one first connector of the plurality of connectors and a plurality of vibration films at the other side of the display device which are commonly connected to one second connector of the plurality of connectors.

2. The display device of claim 1, wherein the leg includes a first leg disposed at one side of the display device and a second leg disposed at the other side thereof.

3. The display device of claim 1, wherein a separation space is formed between a horizontal part of the vibration bracket and the at least one plate.

4. The display device of claim 3, further comprising a piezoelectric material disposed in the separation space.

5. The display device of claim 3, wherein the horizontal part includes a plurality of horizontal parts including a first horizontal part and a second horizontal part, and the vibration film is attached to each of the plurality of horizontal parts.

6. The display device of claim 1, wherein the at least one plate includes a first plate disposed under the display panel and a second plate disposed under the first plate, and the second plate is made of a metal material.

7. The display device of claim 6, wherein the second plate and the vibration bracket are directly attached through a bonding material.

8. The display device of claim 1, further comprising a first terminal connected to the vibration film and a second terminal connected to a control board.

9. The display device of claim 8, wherein the number of first terminals is larger than the number of second terminals.

10. The display device of claim 8, wherein the number of first terminals is the same as the number of second terminals.

11. The display device of claim 8, wherein some of the plurality of connectors overlap each other.

12. The display device of claim 11, wherein a number of the connectors is the same as a number of the first terminals and a number of the second terminals.

13. The display device of claim 1, wherein the vibration bracket includes a plurality of brackets including a first bracket and a second bracket.

14. The display device of claim 13, wherein the vibration film includes a plurality of vibration films attached to the first bracket and a plurality of vibration films attached to the second bracket.

15. The display device of claim 1, wherein the vibration film includes an anode, a cathode, and piezoelectric ceramic between the anode and the cathode.

16. The display device of claim 1, wherein the vibration film includes a plurality of vibration films attached to one vibration bracket.

17. The display device of claim 1, wherein the first connector and the second connector are connected to one control board through a second terminal.

18. A display device comprising:

a cover window;

a display panel disposed under the cover window;

at least one plate disposed under the display panel;

a vibration bracket attached to a lower portion of the at least one plate; and a plurality of vibration films attached to a lower portion of the vibration bracket, wherein the vibration bracket includes a leg protruding upward, wherein the vibration bracket further includes a plurality of bridges extending from the legs and disposed between the plurality of vibration films adjacent to each other, wherein the vibration bracket further includes a horizontal part to which the vibration film is attached, and wherein the leg includes a first leg that protrudes upward from one side of the horizontal part and a second leg that protrudes upward from the other side of the horizontal part.

* * * * *